(12) United States Patent
Nagaraj

(10) Patent No.: US 6,414,611 B1
(45) Date of Patent: Jul. 2, 2002

(54) REDUCTION OF APERTURE DISTORTION IN PARALLEL A/D CONVERTERS

(75) Inventor: Krishnaswamy Nagaraj, Somerville, NJ (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/545,550

(22) Filed: Apr. 7, 2000

Related U.S. Application Data

(60) Provisional application No. 60/128,313, filed on Apr. 8, 1999.

(51) Int. Cl.[7] .......................... H03M 1/06; H03M 1/00; H03M 1/12
(52) U.S. Cl. .................. 341/118; 341/122; 341/15.5
(58) Field of Search .................. 327/99, 161; 341/118, 341/122, 15.5

(56) References Cited

U.S. PATENT DOCUMENTS 5,886,562 A * 3/1999 Garrity .................. 327/99
6,049,236 A * 4/2000 Walden .................. 327/99

* cited by examiner

Primary Examiner—Trong Phan
(74) Attorney, Agent, or Firm—W. Daniel Swayze, Jr.; W. James Brady; Frederick J. Telecky, Jr.

(57) ABSTRACT

A method and circuit for improving the aperture distortion in parallel A/D converters by reducing the delay mismatch in the sample-and-hold portion of A/D converter circuit. The technique involves generating two complementary clocks, Q and $\bar{Q}$, from a single master clock and then gating these two clocks, in a random fashion, with the original master clock in order to significantly reduce the delay mismatch in the circuit. This approach involves the random selection of gated switches from dual banks each containing a plurality of parallel switches, thereby compensating for aperture error by converting any systematic aperture mismatch between the sampling clocks into random noise spread over the frequency band. High speed A/D converters incorporating the techniques of this invention will provide superior performance in digital audio, digital video, and many other digital applications.

5 Claims, 3 Drawing Sheets

REDUCTION OF APERTURE DISTORTION IN PARALLEL A/D CONVERTERS

This application claims priority under 35 USC §119 (e)(1) of Provisional Application No. 60/28,313, filed Apr. 8, 1999.

BACKGROUND OF THE INVENTION

1. Field of the Invention

The present invention relates to analog-to-digital (A/D) converter circuits and more specifically to the reduction of aperture distortion in parallel circuits of this type by conditioning of the sample-and-hold clocks.

2. Description of the Related Art

FIG. 1a shows a typical block diagram for a two channel parallel A/D converter circuit. In this circuit, the analog input signal is directed along two parallel data paths, each consisting of a sample-and-hold (S/H) circuit in series with an analog-to-digital converter circuit; i.e., one path comprised of S/H 10 in series with A/D 12 and the other path comprised of S/H 11 in series with A/D 13. The two paths are then coupled to a digital multiplexer 14 where the signals are recombined to provide the digital output. The analog input signal is sampled in an odd-even fashion within the two signal paths by means of sample-and-hold clocks, Clock A and Clock B.

FIG. 1b shows the timing diagram for the typical two channel A/D converter circuit of FIG. 1a. Clock A is the clock for. one of the parallel channel sample-and-hold circuits and Clock B is the clock for the other parallel channel sample-and-hold circuit, with Clock A and Clock B being complementary. Typically, the analog signal $V_{in}$ is sampled on the trailing or negative edge of these clock pulses, as shown, alternating between Clock A and Clock B. Ideally, the high-to-low sampling edge of the clocks should be exactly 1/T apart in time, where T is the period of the clock pulse. However, in practice this is normally not the case due to the delay mismatch of the circuit parameters which can result in the presence of intermodulation tones in the sampled signal, given by $$fin \pm \frac{fs}{2};$$

where fs is the sampling frequency.

Typically, in attempting to minimize this circuit mismatch, a method of generating the complementary sample-and-hold clock signals from a single master clock, as shown in FIG. 2, is used. Here, the complementary Clock A and Clock B signals are generated, by means of a divide-by-2 flip-flop 20 circuit, from a master clock signal. However, the drawback of this simple approach is that of signal delay, caused by component mismatching in the divide-by-2 flip-flop 20, which can result in significant delay between Clock A and Clock B, resulting in aperture distortion in the A/D converter.

One approach for improving the delay mismatch in the above circuit is to recombine the generated complementary clocks with the master clock by means of gating the two together, as shown in FIG. 3, in order to remove some of the delay mismatch. In operation, the circuit generates two complementary sample-and-hold clocks, Clock A and Clock B, from a single master clock signal. The circuit is comprised of a flip-flop (F/F) 30 and two transmission gates (gated switches) 31–32. The complementary outputs, Q and $\overline{Q}$, of flip-flop 30 are connected, respectively, to the inputs of the two gated switches 31–32. A master clock (Clk) is connected to the input of flip-flop 30 and to the gates of switches 31–32. Finally, the outputs of the gated switches 31–32 provide the conditioned Clock A and Clock B sample-and-hold signals. In this circuit, the delay mismatch introduced by flip-flop 30 is effectively removed by gating the two flip-flop 30 output signals, Q and $\overline{Q}$, again with the master clock by means of the two gated switches 31–32. However, there is some amount of delay mismatch introduced between the two signals by the two transmission gates 31–32 themselves, although this mismatch can be minimized and somewhat controlled by matching the threshold of the gates and by maintaining the overall circuit time constant at a minimum. These factors can be addressed during the design of the integrated circuit.

The new approach of this invention addresses the drawbacks of the above circuits and significantly improves the aperture distortion problem found in many typical parallel A/D converter circuits.

SUMMARY OF THE INVENTION

A method and circuit for reducing the aperture distortion in parallel A/D converters by improving the delay mismatch in the sample-and-hold stages of the circuit is disclosed. The technique involves generating two complementary sample-and-hold signals, Q and $\overline{Q}$, from a single master clock and then gating them again with the original master clock in a random fashion to significantly reduce delay mismatch between them, thereby improving the aperture distortion in the circuit. It is the random nature of the approach that constitutes this invention.

In this approach, the sample-and-hold circuit's delay mismatch is further reduced by providing a plurality of randomly selected parallel paths for gating the generated complementary signals, Q and $\overline{Q}$, with the master clock. These parallel paths each consist of a randomly selected switch in series with a master clock switch. This technique tends to convert any systematic aperture mismatch between the two generated complementary clocks, Clock A and Clock B, into random noise which is spread over a wide band of frequencies.

High speed parallel A/D converters utilizing the sample-and-hold aperture distortion reduction techniques of this invention are used in, but are not limited to, such applications as:

1) video signal processing,
2) video bandwidth compression,
3) digital video transmission/reception,
4) digital audio processing,
5) digital image enhancement,
6) radar signal analysis, and
7) others.

DETAILED DESCRIPTION

The present invention discloses techniques for reducing the aperture distortion in parallel A/D converter circuits by improving the delay mismatch in the sample-and-hold stages of the circuit.

Figure 1A:
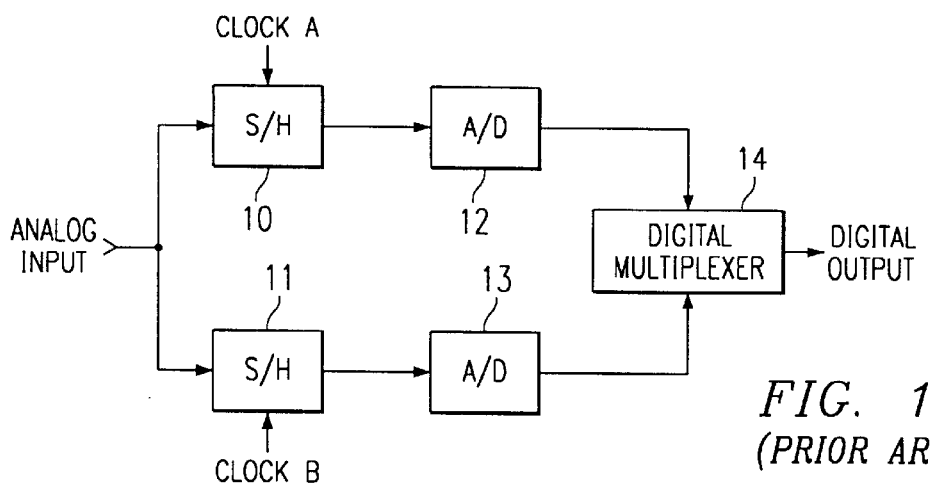
FIG. 1a is a block diagram for a typical two channel parallel A/D converter. (related art)
Figure 1B:
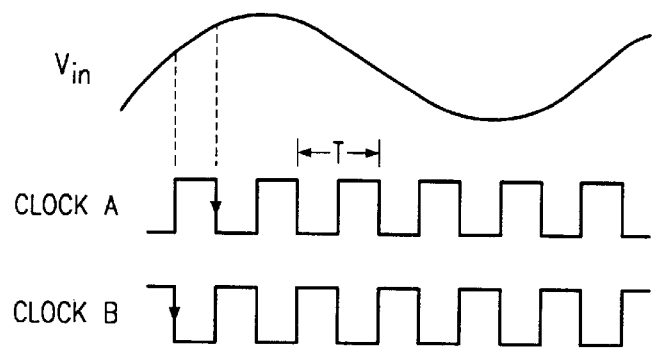
FIG. 1b is the timing diagram for the two channel parallel A/D converter of FIG. 1a. (related art)
Figure 2:
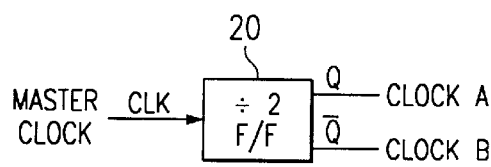
FIG. 2 is a block diagram for generating two complementary clock signals from a single master clock. (related art)
Figure 3:
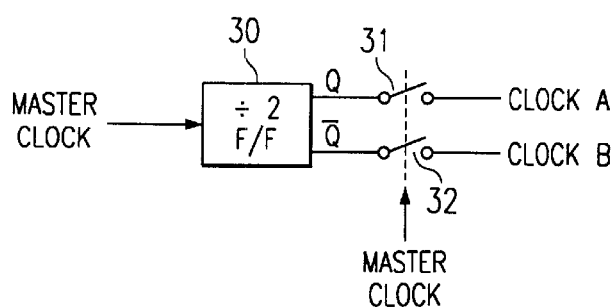
FIG. 3 is a block diagram showing a typical approach for generating complementary sample-and-hold clocks with reduced aperture distortion for use in parallel A/D converter circuits. (related art)
Figure 4A:
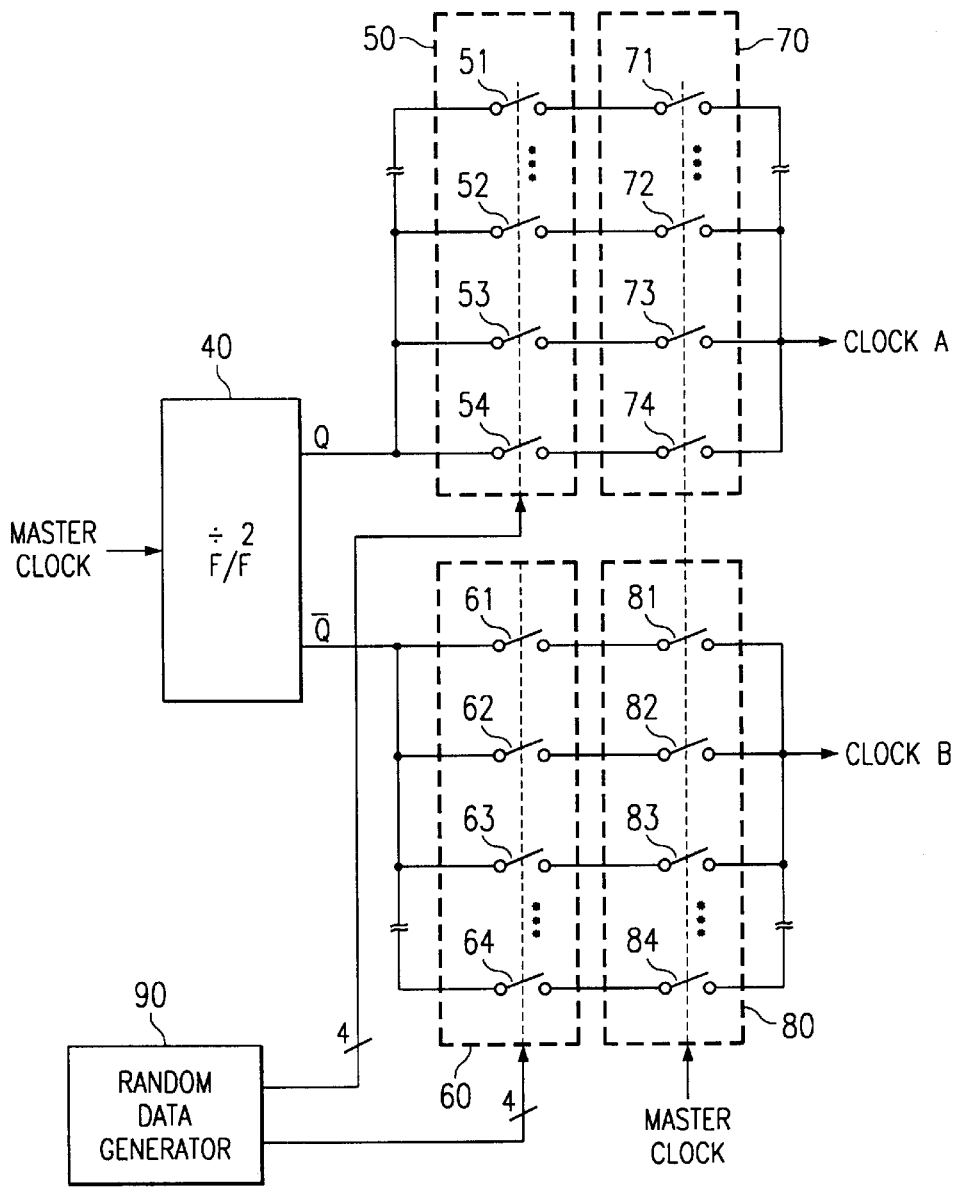
FIG. 4a is a block diagram showing the method of generating conditioned complementary sample-and-hold clocks as used in the preferred embodiment of this invention for significantly reducing the aperture distortion in parallel A/D converter circuits.

FIG. 4a shows a preferred embodiment which significantly improves the delay mismatch in the circuit by randomizing the aperture error. Here, a plurality of parallel gated switch paths are provided and are chosen randomly so as to effectively reduce the delay mismatch in the gates. The circuit is comprised of a divide-by-2 flip-flop 40 which generates complementary output signals, Q and $\overline{Q}$, from a master clock input signal (Clk). The Q and $\overline{Q}$ outputs of the flip-flop 40 are coupled to the inputs of two banks 50 and 60 of randomly gated switches, 51–54 and 61–64, respectively. The output of these randomly gated switches are connected to the corresponding inputs of the two banks 70 and 80 of master clock gated switches 71–74 and 81–84, respectively, all of which are clocked at the master clock rate, as indicated. The outputs of the gated switches 71–74 are coupled together to provide the Clock A sample-and-hold signal. Similarly, the outputs of the gated switches 81–84 are coupled together to provide the Clock B sample-and-hold signal. Finally, a random data generator 90 generates the random clock signals for enabling the random gated switches in banks 50 and 60. This random data generator can have individual gate signals for each of the random gated switches or can be used to supply the random gate signals between the two banks of switches in pairs; e.g., the gates of random gate switches 53 and 63 are driven from the same random gate signal. Although the switch banks are shown to have 4 gated switches each, this approach can be expanded by adding additional gated switches, as required, for finer reduction of aperture distortion, as illustrated. In operation, one or more of the parallel paths are randomly selected, under control of the random data generator 90, for both the Q and $\overline{Q}$ signals during each cycle. As a result, any systematic aperture mismatch between the sample-and-hold clocks, Clock A and Clock B, is converted into random noise which is distributed over a band of frequencies rather than appearing as discrete intermodulation tones in the clock signals.

Figure 4B:
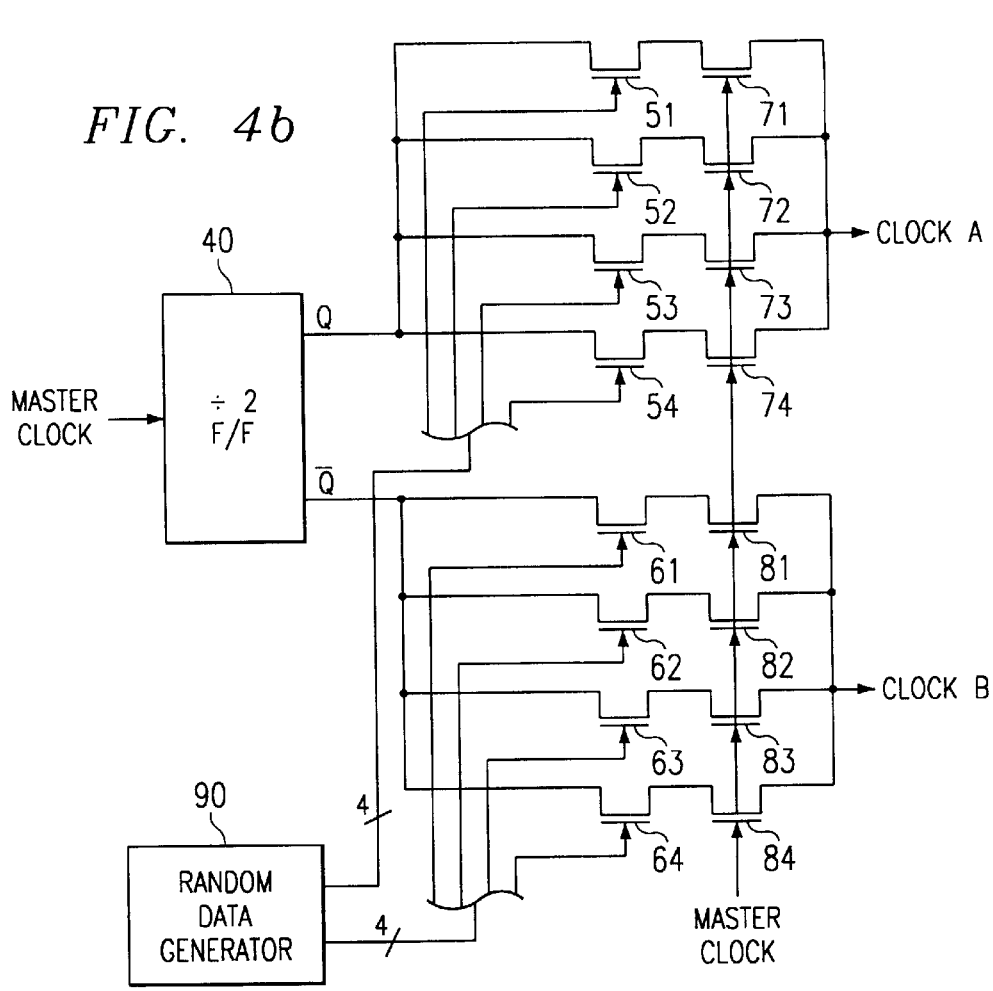
FIG. 4b is a schematic for implementing the circuit of FIG. 4a using MOS transistors.

FIG. 4b shows the sample-and-hold complementary circuit of FIG. 4a implemented using MOS transistors. As in the first embodiment, all the switches 51–54, 61–64, 71–74, and 81–84, can be implemented with MOS or bipolar switch technology.

Figure 5:
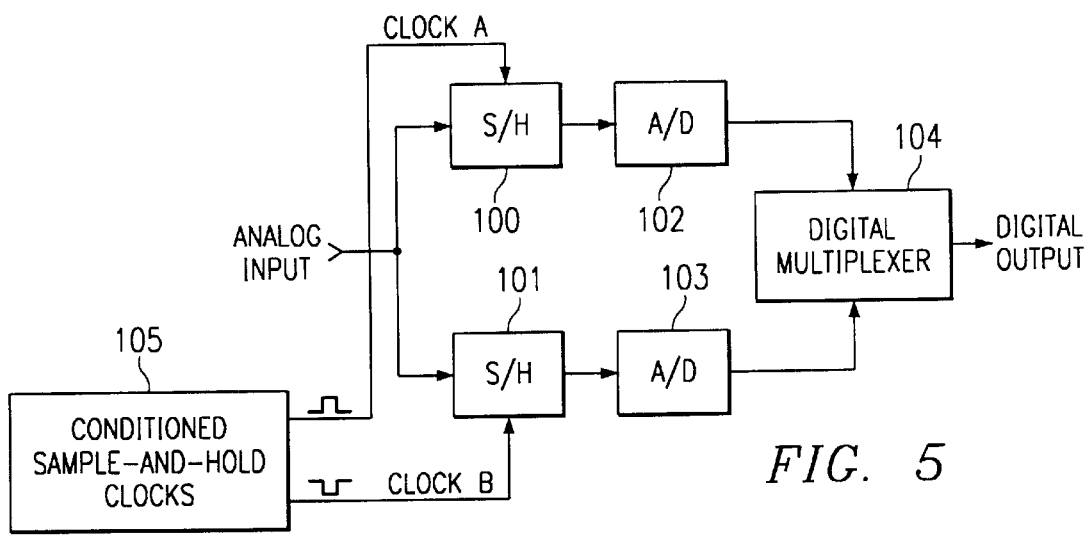
FIG. 5 is a block diagram of a parallel analog-to-digital converter which incorporates the conditioned complementary sample-and-hold clocks of this invention.

FIG. 5 is a block diagram for a parallel analog-to-digital converter with conditioned complementary sample-and-hold clocks generated by the method of this invention. Here a typical parallel A/D converter, comprised of two parallel signal paths each consisting of a sample-and-hold circuit 100/101 and an A/D converter circuit 102/103 in series and a digital multiplexer 104 where the two signals are recombined at the output, has added a circuit 105 for conditioning the sample-and-hold clocks. In operation, the analog input signal is sampled in an odd-even fashion in the two paths, digitized, and then recombined in the digital multiplexer to provide the high speed digital output signal. The effects of the disclosed novel approach is to significantly improve the aperture distortion in the parallel A/D converter by reducing the delay mismatch in the sampling stages of the circuit by means of the sample-and-hold conditioning circuitry.

While the invention has been described in the context of preferred embodiments, it will be apparent to those skilled in the art that the present invention may be modified in numerous ways and may assume embodiments other than that specifically set out and described above. Accordingly, it is intended by the appended claims to cover all modifications of the invention which falls within the true spirit and scope of the invention.

I claim:

1. A circuit for minimizing a delay mismatch in complementary sample-and-hold clocks by providing a plurality of randomly selected parallel paths through which two generated complementary signals are gated with an original master clock, said original master clock generating a master clock signal, comprising:

a flip-flop circuit;

a random data generator;

a first and second bank of randomly selected gated switches each comprising a plurality of parallel switch elements having randomly selectable gates;

a first and second bank of master clock gated switches each comprising a plurality of parallel switch elements having non-selectable gates;

outputs of said first and said second bank of said master clock gated switches respectively coupled together to produce a first and a second sample-and-hold clock signal.

2. The circuit of claim 1, wherein said first and second sample-and-hold clocks are complementary.

3. The circuit of claim 1, wherein said random gated switches and said master clock gated switches are MOS transistors.

4. The circuit of claim 1, wherein:

first and second outputs of said flip-flop circuit are respectively coupled to inputs of first, second, third, and fourth gated switches in said first and second banks of randomly gated switches;

outputs of said first, second, third, and fourth gated switches in the said respective first and second banks of randomly gated switches are coupled to the respective first, second, third, and fourth inputs of said gated switches in said first and second banks of master clock gated switches;

the outputs of said first, second, third, and fourth gated switches in said first and second banks of master clock gated switches are coupled together to provide the said first and second sample-and-hold output clock signals;

said master clock signal is coupled to the input of said flip-flop circuit and to all gates of said first and second banks of said master clock gated switches;

the first, second, third, and fourth outputs of said random data generator are coupled to the respective gates of said first, second, third, and fourth gated switches in the said first and second banks of random gated switches, respectively.

5. The circuit of claim 1, wherein:

the first, second, third, and fourth outputs of said random data generator are coupled to the respective gates of said first, second, third, and fourth gated switches in the said first bank of random gated switches; and the fifth, sixth, seventh, and eighth outputs of said random data generator are coupled to the respective gates of said first, second, third, and fourth gated switches in the said second bank of random gated switches.

* * * * *